United States Patent [19]
Hurd

[11] Patent Number: 6,069,478
[45] Date of Patent: May 30, 2000

[54] MAGNETIC RESONANCE SPECTROSCOPIC IMAGING HAVING REDUCED PARASITIC SIDE BAND SIGNALS

[75] Inventor: Ralph E. Hurd, Milpitas, Calif.

[73] Assignee: General Electric Corporation, Milwaukee, Wis.

[21] Appl. No.: 08/976,753

[22] Filed: Nov. 24, 1997

[51] Int. Cl.[7] ....................................................... G01V 3/00
[52] U.S. Cl. ............................ 324/307; 324/309; 324/300; 600/410
[58] Field of Search ................................... 324/309, 307, 324/300, 314, 312; 600/410

[56] References Cited

PUBLICATIONS

Peter G. Webb et al., "Automated Single–Voxel Proton MRS: Technical Development and Multisite Verification", Magnetic Resonance in Medicine 31, (1994), pp. 365–373.
Andrew Gibbs et al., "Reference Deconvolution. Elimination of Distortions Arising from Reference Line Truncation", Journal of Magnetic Resonance 91, (1991), pp. 77–83.
A. A. de Graaf et al., "Quality: A General Method for Lineshape COrrection in In Vivo NMR SPectroscopy", (1998), 8th Annual SMRM, p. 244.
Gareth A. Morris, "Compensaiton of Instrumental Imperfections by Deconvolution Using an Internal Reference Signal", Journal of Magnetic Resonance 80, (1988), pp. 547–552.

*Primary Examiner*—Christine K. Oda
*Assistant Examiner*—Brij B. Shrivastav
*Attorney, Agent, or Firm*—Townsend and Townsend and Crew LLP; Henry K. Woodward

[57] ABSTRACT

A pure water subtraction method for eliminating interfering sidebands of residual water including spurious signals from extraneous sources such as eddy current effects, Bo magnetic field drift, patient motion and the like. Unsuppressed and partially water suppressed magnetic signal data are obtained, and a low frequency water-phase-correction is applied thereto. The water phase corrected partially suppressed data is subtracted from the water phase corrected unsuppressed data to get a pure water reference (i.e. metabolite signals cancel). A scaled version of the pure water reference is subtracted from the partially suppressed data to eliminate spurious water signals.

6 Claims, 1 Drawing Sheet

MAGNETIC RESONANCE SPECTROSCOPIC IMAGING HAVING REDUCED PARASITIC SIDE BAND SIGNALS

BACKGROUND OF THE INVENTION

This invention relates generally to magnetic resonance spectroscopy, and more particularly, the invention relates to volume spectroscopy in which parasitic signal interference is reduced.

Volume localized magnetic resonance spectroscopy has become a useful and routine clinical tool especially for the detection of abnormalities which lead to diffused chemical changes in the brain. Several techniques are know for directly exciting spins of metabolites such as choline, creatine and NAA in a volume of interest and achieving three-dimensional selection including use of stimulated echoes and the use of Carr-Purcell echoes. These techniques obtain a localized spectrum in a single scan. For example, point resolved spectroscopy (PRESS, see U.S. Pat. No. 4,480,228) uses a three pulse sequence with each pulse being frequency selective. Many important clinical applications of proton magnetic resonance spectroscopic imaging, MRSI, are based on phase encoding of a restricted volume of excitation. Typically, the volume excitation is achieved using PRESS, which takes advantage of three orthogonal slices in the form of a double spin echo to select a specific region of interest.

A strong water signal is present in the metabolite signals and is used to correct for phase and frequency errors due to extraneous effects. However, coherent side bands of residual water can interfere with the measurement of metabolites in localized proton spectroscopy. Typically, low frequency distortions of the metabolic and residual water signals are corrected using an unsuppressed water reference, but harmonic distortions above 20 Hz are in the range of the metabolite frequencies and are necessarily not corrected for by this approach. There are a number of potential sources for parasitic side bands including acoustic and eddy current coupling effects. The side bands which cause problems are those which are coincident with the in vivo proton chemical shift frequency range (30 Hz to 220 Hz at 1.5 T), have time constants of greater than 10 ms and have peak to peak magnitudes of greater than 0.2%. These side bands depend on magnet and gradient system, and are dependent on pulse sequence and TE. In typical probe-p (PRESS) spectra at TE 35, these side bands are observed throughout the spectral region of interest and range in size from 0.1% to over 1.0%. Typical decay constants are such that they do not pose a serious problem in the TE 144 spectra. They also do not present a problem if water is completely suppressed. This condition is limited, however, by the constraints it puts on water suppression automation, and more importantly, by the need for a relatively strong residual water signal to correct for temporal (frame to frame) phase and frequency errors due to very long time constant eddy current effects, Bo field drift and patient motion. Thus, there is a need to eliminate these side bands from an otherwise useful water signal, without impacting SNR.

Heretofore, a number of line shape correction method which have been used to correct for frequency independent line shape errors but in these methods reference signal is extracted and divided by an ideal signal and then used as a multiplier to correct the raw spectrum. This approach is highly sensitive to the method by which the reference line shape is extracted and often introduces additional noise.

SUMMARY OF THE INVENTION

In accordance with the invention an appropriately scaled portion of the pure water reference signal is subtracted from a partially suppressed magnetic reference signal to eliminate interfering sidebands of the residual water.

It has been discovered that the higher frequency distortions of the water signal from extraneous sources such as eddy current effects, Bo field drift and patient motion, scale with the residual amplitude of the main water signal peak, independent of the frequency selectivity of the suppression method. Thus unsuppressed signal minus a partially suppressed water spectrum will cancel the metabolite signals of interest and leave only the water line reference and its parasitic sidebands. The resulting signal is the pure water reference with sidebands.

In a preferred embodiment of the invention, an unsuppressed magnetic resonance water reference signal is acquired along with the partial water suppressed data.

A low frequency water-phase-correction is applied to the water reference and data, as taught by Webb et al., Magnetic Resonance in Medicine 31:365–373 (1994).

The water-phase-corrected data is then subtracted from water-phase-corrected unsuppressed data to obtain a pure water reference without metabolite signal data.

The water phase corrected data is integrated over sampling time and divided by the integral over sampling time of the pure water reference. The real component of the quotient is then taken as a multiplier, R.

The product of the multiplier, R, and the pure water reference is then subtracted from the Bo corrected partially suppressed data to eliminate spurious water signals.

The invention and objects and features of the invention will be more fully understood form the following description and appended claims when taken with the drawings.

DESCRIPTION OF THE PREFERRED EMBODIMENT

Figures 1A, 1B:
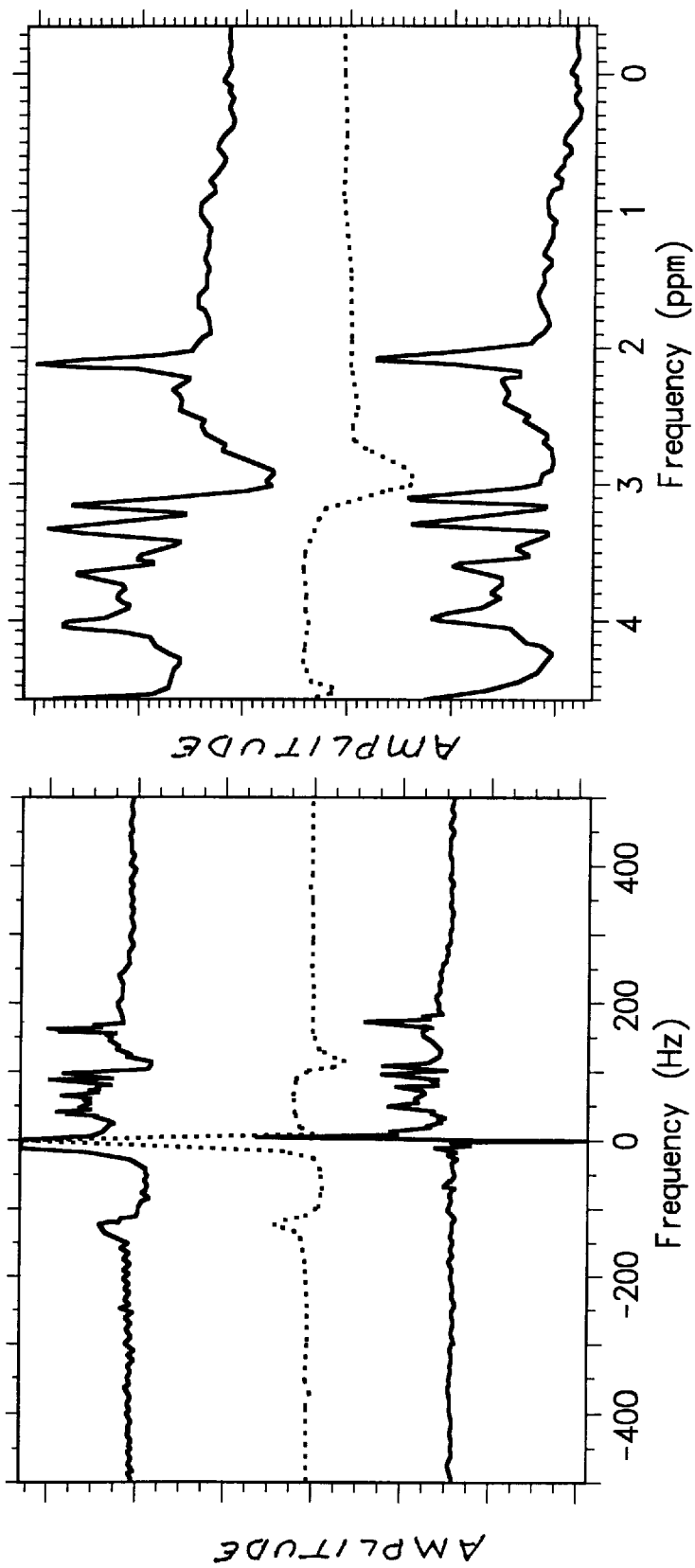
FIG. 1A is a plot versus frequency (Hz) of unsuppressed data, a pure water reference, and the remainder from subtracting an appropriately scaled pure water reference from the unsuppressed data.
FIG. 1B is a plot versus frequency (parts per million-ppm) of the data of FIG. 1A.

FIGS. 1A and 1B are plots versus frequency in Hz and in PPM, respectively, of unsuppressed data, a pure water reference obtained in accordance with the invention, and the unsuppressed data with spurious water signals removed by subtracting an appropriately scaled pure water reference from unsuppressed data. In FIG. 1B, frequency is expressed as parts per million (ppm) as a frequency offset from Larmor frequency, which is dependent on the nuclei being excited and the applied magnetic field.

The conventional unsuppressed data at the top shows a broad positive baseline distortion between 20 Hz and 100 Hz and a sharper negative side band at 108 Hz. These combine to distort the apparent levels of the metabolites to be measured, especially the relative amounts of choline, creatine and NAA. The dotted spectrum in the middle curve is the pure water reference appropriately scaled to the size of the residual water. The third spectrum at the bottom is the data after the application of pure water subtraction.

The data can be represented by the following equations:

$$Unsuppressed\_data = Signal_{H2O} + Signal_{metabolites} + Noise_{ref} \qquad [1]$$

$$Partially\_suppressed\_data = Signal_{residual\_H2O} + Signal_{metabolites} +$$

$$Noise_{data} \quad [2]$$

$$Pure\_water = Unsuppressed\_data - Partially\_suppressed\_data = Signal_{(H2O-residual)} + RMS(Noise_{ref} + Noise_{data}) \quad [3]$$

$$PWS\_Corrected\_data = Signal_{metabolites} + Noise_{data} + R(Noise_{pure\_water}) \quad [4]$$

$$(R = Signal_{residual-H2O}/Signal_{pure\_water} < 0.1) \quad [5]$$

To avoid any measurable impact from the noise of the water correction data, water suppression should be a minimum of 10:1, which is not a very rigorous requirement. In this case, over rotation of the water magnetization ($-M_z$) is slightly better than under rotation ($+M_z$) since the "pure water reference" is increased by the residual in over rotation leading to a smaller multiplier, R.

In obtaining the multiplier R, the integral taken over sampling time is in effect a Fourier selection of the pure absorption zero frequency water signal, assured by the water-phase-correction in the previous step. This step is especially important in the estimation to small residual water signals, where the metabolites are a significant fraction of the partially water suppressed FID or echo. As described, the method operates completely in the time domain but an equivalent procedure could be constructed in the frequency domain.

The invention has been implemented in the PROBE Recon in the off-line processing package sage/idl and tested with both in vivo and phantom data. An in vivo example of the method is illustrated in FIG. 1.

While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. In magnetic resonance spectroscopy, a method of processing signals to reduce interfering sidebands of a pure water reference comprising the steps of:

a) obtaining unsuppressed magnetic resonance signal data, b) obtaining a partially water suppressed signal data, c) subtracting the partially water suppressed signal data from the unsuppressed magnetic resonance signal data to cancel metabolite signal data and leave a pure water reference data, and d) subtracting scaled pure water reference data from the partially water suppressed signal data to reduce interfering sidebands and spurious water signals.

2. The method as defined by claim 1 wherein step a) includes averaging multiple frames of data to obtain averaged data, and step c) includes obtaining an average pure water reference.

3. The method as defined by claim 2 wherein step b) includes applying low frequency water-phase-correction to the averaged data and to the averaged pure water reference to obtain water phase corrected data and water phase corrected unsuppressed data.

4. The method as defined by claim 3 wherein step d) includes dividing the integral over sampling time of the water-phase corrected data by the integral over sampling time of the pure water reference to obtain a multiplier factor for scaling the pure water reference data.

5. The method as defined by claim 4 wherein the multiplier factor is the real component of the quotient.

6. The method as defined by claim 4 wherein the integral over sampling time is a Fourier selection of the pure absorption zero frequency water signal.

* * * * *